(12) United States Patent
Tsai et al.

(10) Patent No.: US 12,112,975 B2
(45) Date of Patent: *Oct. 8, 2024

(54) MECHANISM FOR FINFET WELL DOPING

(71) Applicant: Taiwan Semiconductor Manufacturing Company, Ltd., Hsinchu (TW)

(72) Inventors: Chun Hsiung Tsai, Xinpu Township (TW); Yan-Ting Lin, Baoshan Township (TW); Clement Hsingjen Wann, Carmel, NY (US)

(73) Assignee: TAIWAN SEMICONDUCTOR MANUFACTURING COMPANY, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/346,622

(22) Filed: Jul. 3, 2023

(65) Prior Publication Data
US 2023/0343634 A1 Oct. 26, 2023

Related U.S. Application Data

(60) Continuation of application No. 17/384,994, filed on Jul. 26, 2021, now Pat. No. 11,742,237, which is a
(Continued)

(51) Int. Cl.
*H01L 21/762* (2006.01)
*H01L 21/02* (2006.01)
(Continued)

(52) U.S. Cl.
CPC .. *H01L 21/76224* (2013.01); *H01L 21/02164* (2013.01); *H01L 21/02222* (2013.01);
(Continued)

(58) Field of Classification Search
CPC ......... H01L 21/76224; H01L 21/02164; H01L 21/02222; H01L 21/02271;
(Continued)

(56) References Cited

U.S. PATENT DOCUMENTS 6,440,808 B1 8/2002 Boyd et al.
7,902,037 B2 3/2011 Eun
(Continued)

FOREIGN PATENT DOCUMENTS

CN 102194687 A 9/2011
CN 103038868 A 4/2013
(Continued)

*Primary Examiner* — Patricia D Valenzuela
(74) *Attorney, Agent, or Firm* — Slater Matsil, LLP

(57) ABSTRACT

The embodiments of mechanisms for doping wells of finFET devices described in this disclosure utilize depositing doped films to dope well regions. The mechanisms enable maintaining low dopant concentration in the channel regions next to the doped well regions. As a result, transistor performance can be greatly improved. The mechanisms involve depositing doped films prior to forming isolation structures for transistors. The dopants in the doped films are used to dope the well regions near fins. The isolation structures are filled with a flowable dielectric material, which is converted to silicon oxide with the usage of microwave anneal. The microwave anneal enables conversion of the flowable dielectric material to silicon oxide without causing dopant diffusion. Additional well implants may be performed to form deep wells. Microwave anneal(s) may be used to anneal defects in the substrate and fins.

20 Claims, 12 Drawing Sheets

Related U.S. Application Data continuation of application No. 16/417,156, filed on May 20, 2019, now Pat. No. 11,075,108, which is a continuation of application No. 15/213,064, filed on Jul. 18, 2016, now Pat. No. 10,297,492, which is a division of application No. 14/137,690, filed on Dec. 20, 2013, now Pat. No. 9,406,546.

(51) Int. Cl.

| | | |
|---|---|---|
| *H01L 21/3115* | (2006.01) | |
| *H01L 27/092* | (2006.01) | |
| *H01L 27/12* | (2006.01) | |
| *H01L 29/06* | (2006.01) | |
| *H01L 29/36* | (2006.01) | |
| *H01L 29/66* | (2006.01) | |
| *H01L 29/78* | (2006.01) | |
| H01L 21/225 | (2006.01) | |
| H01L 21/265 | (2006.01) | |
| H01L 21/8234 | (2006.01) | |
| H01L 27/088 | (2006.01) | |
| H01L 29/08 | (2006.01) | |
| H01L 29/10 | (2006.01) | |

(52) U.S. Cl.
CPC .. *H01L 21/02271* (2013.01); *H01L 21/02274* (2013.01); *H01L 21/02318* (2013.01); *H01L 21/02321* (2013.01); *H01L 21/02326* (2013.01); *H01L 21/02337* (2013.01); *H01L 21/31155* (2013.01); *H01L 21/76237* (2013.01); *H01L 27/0924* (2013.01); *H01L 27/1211* (2013.01); *H01L 29/0649* (2013.01); *H01L 29/36* (2013.01); *H01L 29/66795* (2013.01); *H01L 29/7851* (2013.01); H01L 21/02296 (2013.01); H01L 21/2255 (2013.01); H01L 21/26513 (2013.01); H01L 21/823431 (2013.01); H01L 27/0886 (2013.01); H01L 29/0847 (2013.01); H01L 29/1054 (2013.01); H01L 29/66803 (2013.01)

(58) Field of Classification Search
CPC ......... H01L 21/02274; H01L 21/02318; H01L 21/02321; H01L 21/02326; H01L 21/02337; H01L 21/31155; H01L 21/76237; H01L 27/0924; H01L 27/1211; H01L 29/0649; H01L 29/36; H01L 29/66795; H01L 29/7851; H01L 21/02296; H01L 21/26513; H01L 21/823431; H01L 29/0847; H01L 29/1054; H01L 29/66803; H01L 21/324; H01L 21/823821; H01L 29/66545; H01L 21/823493; H01L 27/0886; H01L 29/785; H01L 29/7856; H01L 21/2255

See application file for complete search history.

(56) References Cited

U.S. PATENT DOCUMENTS

| | | |
|---|---|---|
| 7,949,390 B1 | 4/2011 | Wirasinghe et al. |
| 8,318,584 B2 | 11/2012 | Li et al. |
| 8,569,183 B2 | 10/2013 | Purtell |
| 8,823,075 B2 | 9/2014 | Purayath et al. |
| 8,846,536 B2 | 9/2014 | Draeger et al. |
| 11,075,108 B2 * | 7/2021 | Tsai .................. H01L 29/0649 |
| 2005/0158934 A1 | 7/2005 | Yun et al. |
| 2006/0110892 A1 | 5/2006 | Orlowski et al. |
| 2006/0244051 A1 | 11/2006 | Izumida et al. |
| 2007/0090416 A1 | 4/2007 | Doyle et al. |
| 2007/0298585 A1 | 12/2007 | Lubomirsky et al. |
| 2011/0049613 A1 | 3/2011 | Yeh et al. |
| 2011/0260253 A1 | 10/2011 | Inaba |
| 2013/0214357 A1 | 8/2013 | Chang et al. |
| 2013/0230987 A1 | 9/2013 | Draeger et al. |
| 2013/0280883 A1 * | 10/2013 | Faul .................. H01L 21/2255 |
| | | 257/E21.144 |
| 2014/0087547 A1 | 3/2014 | Miyano et al. |
| 2014/0117462 A1 | 5/2014 | Cheng et al. |
| 2014/0117466 A1 | 5/2014 | Jagannathan et al. |
| 2014/0151760 A1 | 6/2014 | Wang et al. |
| 2014/0361380 A1 | 12/2014 | Kim |
| 2015/0104923 A1 | 4/2015 | Tsai et al. |
| 2015/0137237 A1 | 5/2015 | Jacob et al. |
| 2016/0056156 A1 | 2/2016 | Ghani et al. |

FOREIGN PATENT DOCUMENTS

| | | |
|---|---|---|
| JP | 2011061196 A | 3/2011 |
| KR | 1020060124387 A | 12/2006 |

* cited by examiner

MECHANISM FOR FINFET WELL DOPING

PRIORITY CLAIM AND CROSS-REFERENCE

This application is a continuation of U.S. patent application Ser. No. 17/384,994, filed on Jul. 26, 2021, and entitled "Mechanism for FinFET Well Doping," which is a continuation of U.S. patent application Ser. No. 16/417,156, filed on May 20, 2019, and entitled "Mechanism for FinFET Well Doping," now U.S. Pat. No. 11,075,108, issued on Jul. 27, 2021, which is a continuation of U.S. patent application Ser. No. 15/213,064, filed on Jul. 18, 2016, and entitled "Mechanism for FinFET Well Doping," now U.S. Pat. No. 10,297,492, issued on May 21, 2019, which is a divisional of U.S. patent application Ser. No. 14/137,690, filed on Dec. 20, 2013, and entitled "Mechanism for FinFET Well Doping," now U.S. Pat. No. 9,406,546, issued on Aug. 2, 2016, which applications are incorporated herein by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type field-effect transistors, also referred to as finFETs, so called because the channel is formed on a "fin" that extends from the substrate. FinFET devices may allow for shrinking the gate width of device while providing a gate on the sides and/or top of the fin including the channel region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
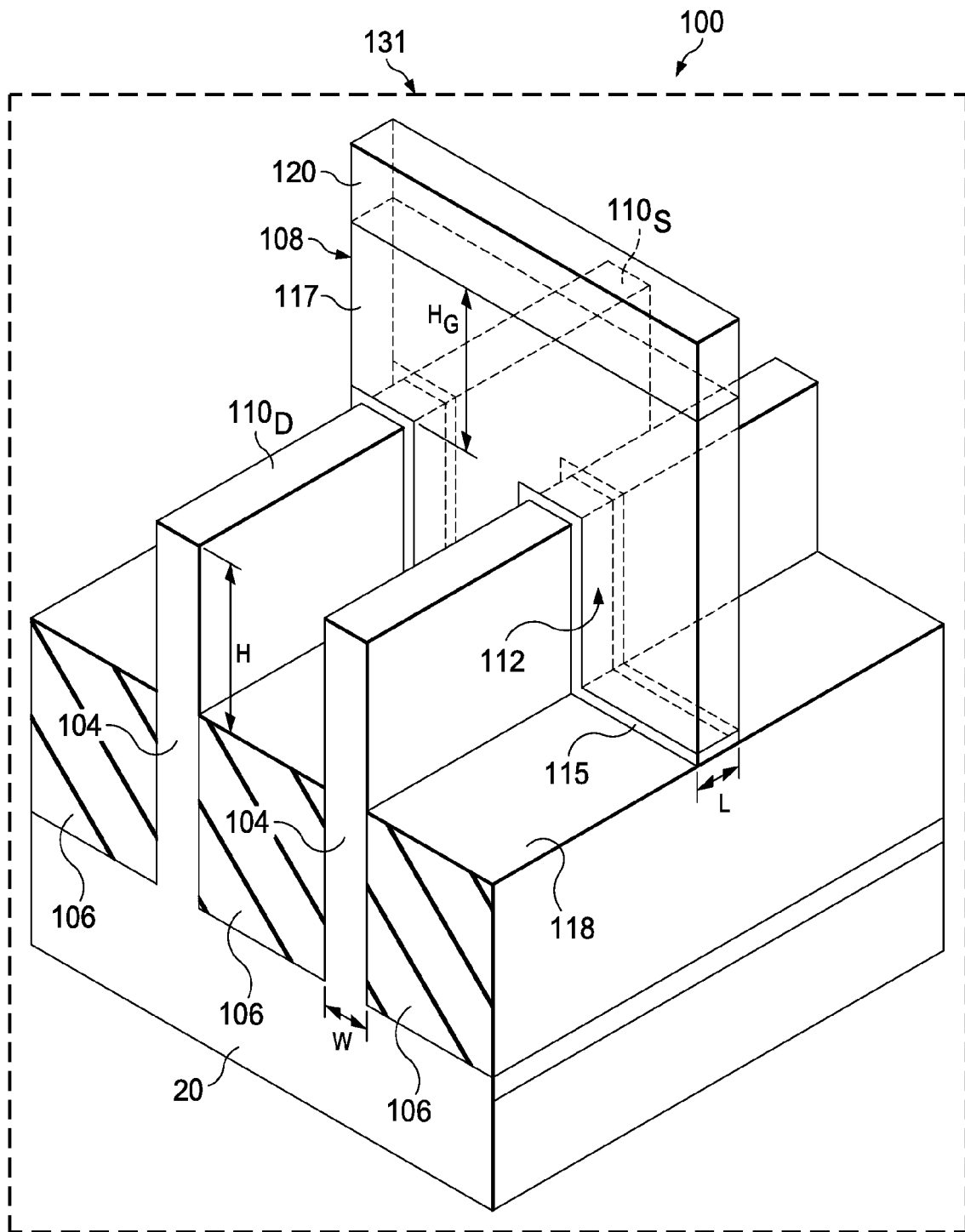
FIG. 1A is a perspective view of an embodiment of a semiconductor device structure, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein that embody the principles of the present disclosure.

It is also noted that the present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, tri-gate device, and/or other configurations. FinFET devices may be included in an IC such as a microprocessor, memory device, and/or other IC. One of ordinary skill may recognize other embodiments of semiconductor devices that may benefit from aspects of the present disclosure.

Illustrated in FIG. 1A is perspective view of a semiconductor device structure 100, in accordance with some embodiments. The semiconductor device structure 100 includes finFET type structures. The semiconductor device structure 100 includes a substrate 20, a plurality of fins 104, a plurality of isolation structures 106, and a gate structure 108 disposed on each of the fins 104. Isolation structures 106 may also be referred to as shallow trench isolation (STI) structures. The gate structure 108 may include a gate dielectric layer 115, a gate electrode layer 117, and/or one or more additional layers. A hard mask layer 120 is over the gate electrode layer 117. The hard mask layer 120 is used to pattern, such as by etching, the gate structure 108. In some embodiments, the hard mask layer 120 is made of a dielectric material, such as silicon oxide. The perspective view of FIG. 1A is taken after the patterning (or forming) process of gate structure 108. FIG. 1A shows only one gate structure 108. There may be additional gate structure(s) (not shown) similar and parallel to the gate structure 108 shown in FIG. 1A.

Each of the plurality of fins 104 include a source region $110_S$ and a drain region $110_D$, where source or drain features are formed in, on, and/or surrounding the fin 104. A channel region 112 of the fin 104 underlies the gate structure 108. The channel region 112 of fin 104 has a length (gate length) L, and a width (gate width) W, as shown in FIG. 1A. In some embodiments, the length (gate length) L is in a range from about 10 nm to about 30 nm. In some embodiments, the width (gate width) W is in a range from about 10 nm to about 20 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 25 nm to about 35 nm, in some embodiments.

The substrate 20 may be a silicon substrate. Alternatively, the substrate 20 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 20 is a semiconductor on insulator (SOI).

The isolation structures 106 are made of a dielectric material and may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 20. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers.

The fin structures 104 may provide an active region where one or more devices are formed. In an embodiment, a channel region 112 of a transistor device is formed in the fin 104. The fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into isolation structures 106, leaving protruding fins. The recesses may be etched using reactive ion etch (RIE) and/or other suitable processes. Numerous other embodiments of methods to form the fins 104 on the substrate 20 may be suitable.

The gate structure 108 may include a gate dielectric layer 115, a gate electrode layer 117, and/or one or more additional layers. In an embodiment, the gate structure 108 is a sacrificial gate structure such as formed in a replacement gate process used to form a metal gate structure. In an embodiment, the gate structure 108 includes polysilicon layer (as the gate electrode layer 117).

The gate dielectric layer 115 of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s), and/or other suitable materials for a metal gate structure. In other embodiments, the metal gate structure 108 may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device structure too described above includes fins 104 and gate structure 108. The semiconductor device structure too needs additional processing to form various features, such as lightly doped drain (LDD) regions and doped source/drain regions, of the transistor utilizing structure 100. LDD regions are next to channel regions and are under spacers. The term LDD regions are used to describe lightly doped regions next to both source and drain regions.

Figure 1B:
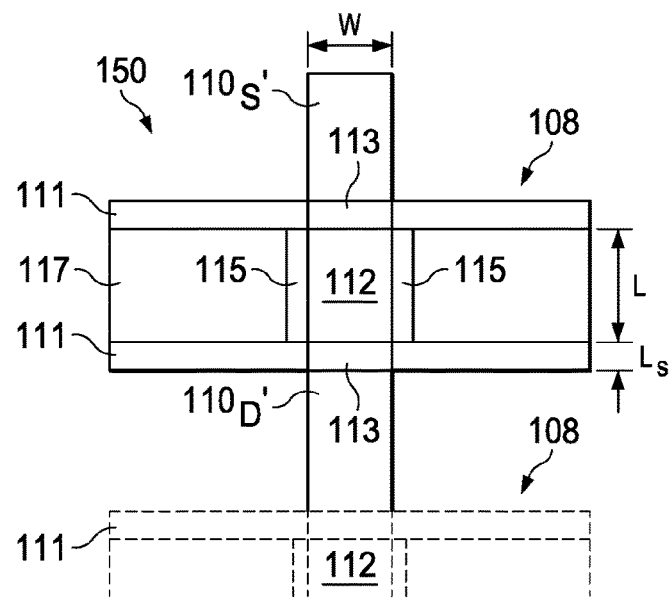
FIG. 1B shows a top view of a transistor region of FIG. 1A, in accordance with some embodiments.

FIG. 1B shows a top view of a transistor region 150 formed with one of the fins 104 of FIG. 1A and taken on a surface level with the top surface 118 of isolation structure 106, in accordance with some embodiments. Transistor region 150 includes a doped source region $110_S$' and a doped drain region $110_D$', which have the same cross-sections as doped source regions $110_S$' and doped drain region $110_D$', respectively, of FIG. 1A at surface 118.

Transistor region 150 also includes a channel region 112, which is part of fin 104 and is surrounded by gate structure 108 on 3 sides, as shown in FIG. 1A. The channel region 112 has a length (gate length) L and a width (gate width) W. Transistor region 150 also includes gate dielectric layer 115 and gate electrode layer 117. FIG. 1B shows LDD regions 113 between source region $110_S$ and channel region 112, and between drain region $110_D$ and channel region 112. The LDD regions 113 have a width W and a length $L_S$, which is defined by the width of spacers 111. In some embodiments, $L_S$ is in a range from about 5 nm to about 10 nm. FIG. 113 shows another gate structure 108 by dotted lines. This other gate structure 108 has been described above as being similar and parallel to the gate structure 108 and is not shown in FIG. 1A.

Figure 1C:
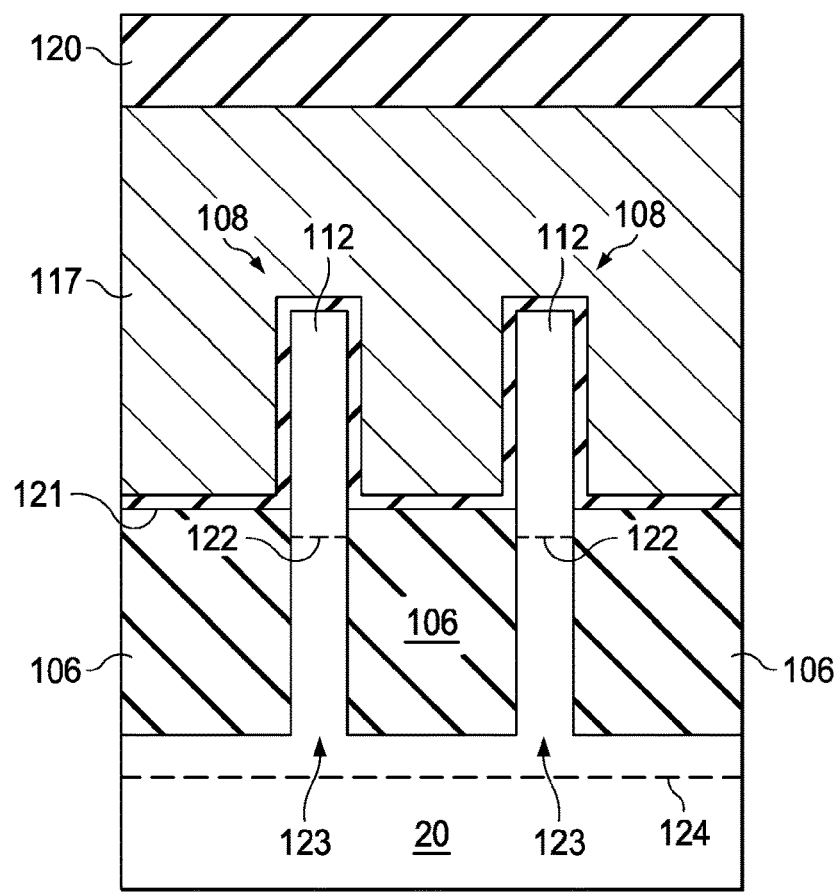
FIG. 1C shows a cross-sectional view of semiconductor device structure of FIG. 1A, in accordance with some embodiments.

FIG. 1C shows a cross-sectional view of semiconductor device structure according to the cut 131 illustrated in FIG. 1A, in accordance with some embodiments. FIG. 1C shows two neighboring gate structures 108. As mentioned above, there may be additional gate structure(s) similar and parallel to the gate structure 108 shown in FIG. 1A. In each gate structure 108, there is a channel region 112. As shown in FIG. 1C, channel regions 112 include portions of fins 104 above isolation structures 106 (or exposed fin sections) and extended slightly below surfaces 121 of isolation structures 106. The edges of channel regions 112 below the exposed fin sections are noted by double dotted lines 122, in accordance with some embodiments. The region below the channel regions 112 is a well region 123 (marked by dotted boundary line 124 in substrate 20). As shown in FIG. 1C, well region 123 is right under channel regions 112 and includes the regions below channel regions 112 of fins 104. Well region 123 extends into a region below fins 104 of substrate 20.

For an n-type field-effect (NFET) transistor, the well region 123 should be doped with p-type dopants to form PN junctions with channel region 121, source region $110_S$, and drain region $110_D$. Similarly, for a p-type FET (or PFET), the well region 123 should be doped with n-type dopants.

Figure 2:
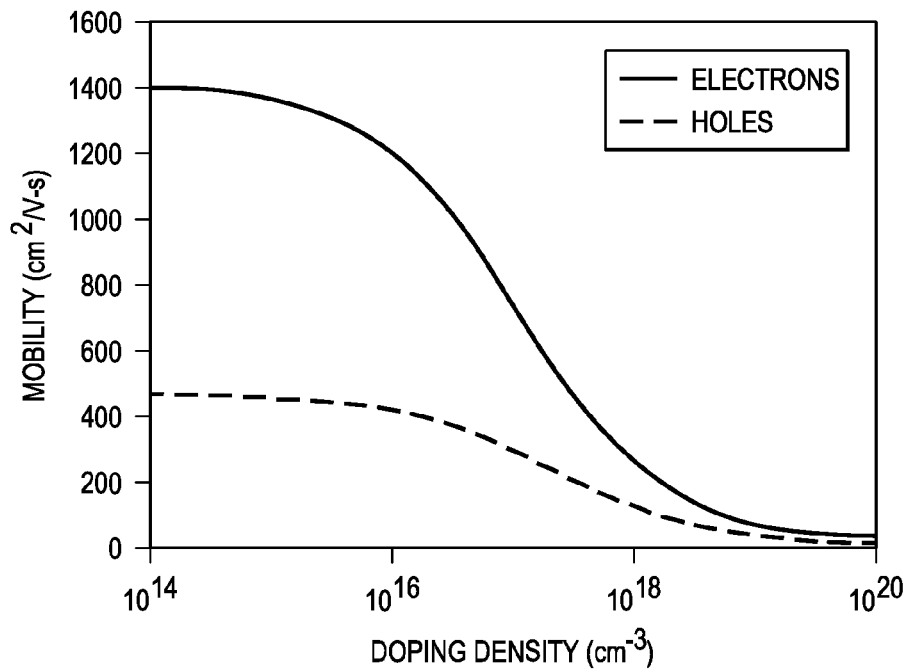
FIG. 2 shows a schematic diagram of mobility versus substrate doping (or dopant) density for electrons and holes, published by Bar Van Zeghbroeck in 2007.

For advanced semiconductor devices, it is desirable to have electrons and holes moving in the channel regions 112 to have high mobility. In order to improve the mobility of electrons and holes, the dopant density of the channel regions 112 needs to be maintained low. FIG. 2 shows a schematic diagram of mobility versus substrate doping (or dopant) density for electrons and holes, published by Bar Van Zeghbroeck in 2007. The diagram shows that mobility of electrons and holes increase with decrease in dopant density. The increase in mobility is very significant (about six times for electrons and about three times for holes) when dopant density decreases from about $10^{18}$ atoms/cm$^{-3}$ to about $10^{16}$ cm$^{-3}$. Simulation results show that by lowering the dopant concentrations in the channel regions 112 from about from about $10^{18}$ atoms/cm$^{-3}$ to about $10^{16}$ cm$^{-3}$, the Ion (on current) gain can increase in a range from about 5% to about 10% for FET, which is very significant.

However, in order to form PN junctions with source regions and drain regions for FETs, the well regions 123 need to have sufficient amount (or concentration) of dopants, which are significantly higher than the channel regions, such as channel region 112.

Well doping can be achieved by implant of dopants. However, a channel region 112 is right next to a well region 123. If well region 123 is doped by implant, it is challenging to keep some portion of channel region 112 with low dopant concentration due to back scattering effect of implanted dopants from the neighboring well region 123. Consequently, it is desirable to have alternative mechanisms for doping the well region, such as region 123, neighboring the channel region, such as region 112.

Figure 3A:
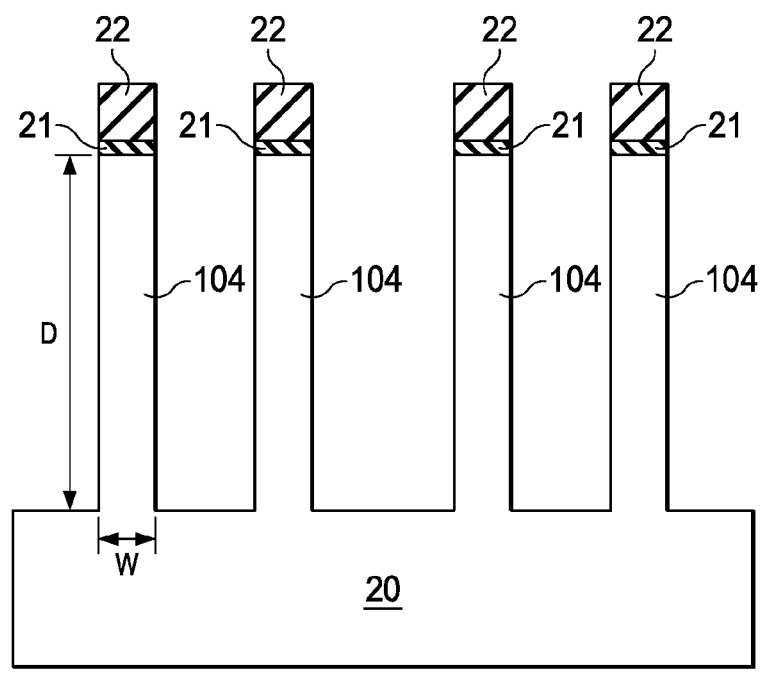
FIGS. 3A-3P illustrate cross-sectional views of a sequential process for forming a finFET structure, in accordance with some embodiments.
Figure 3B:
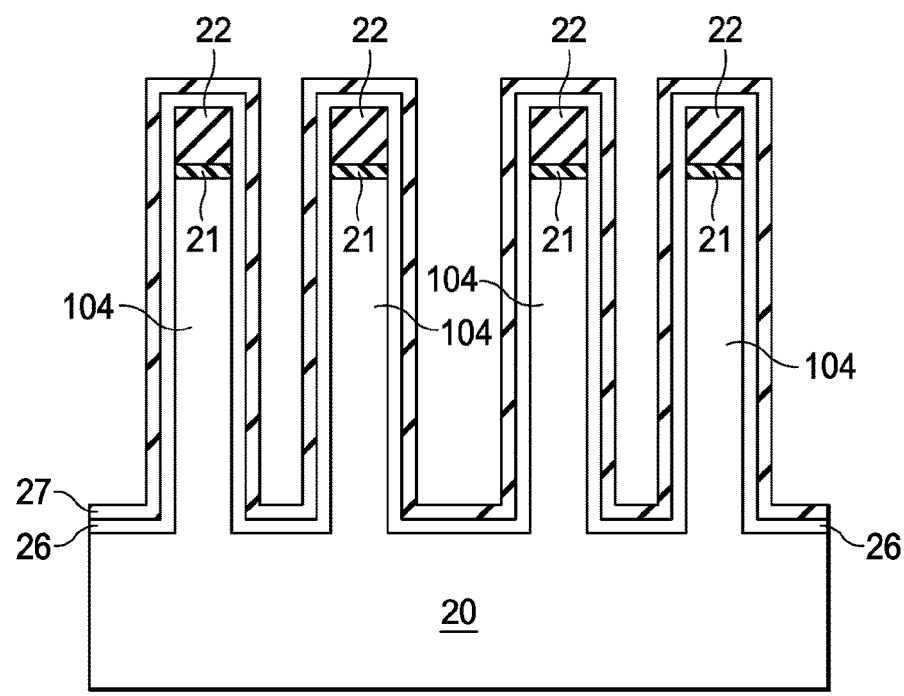
Figure 3C:
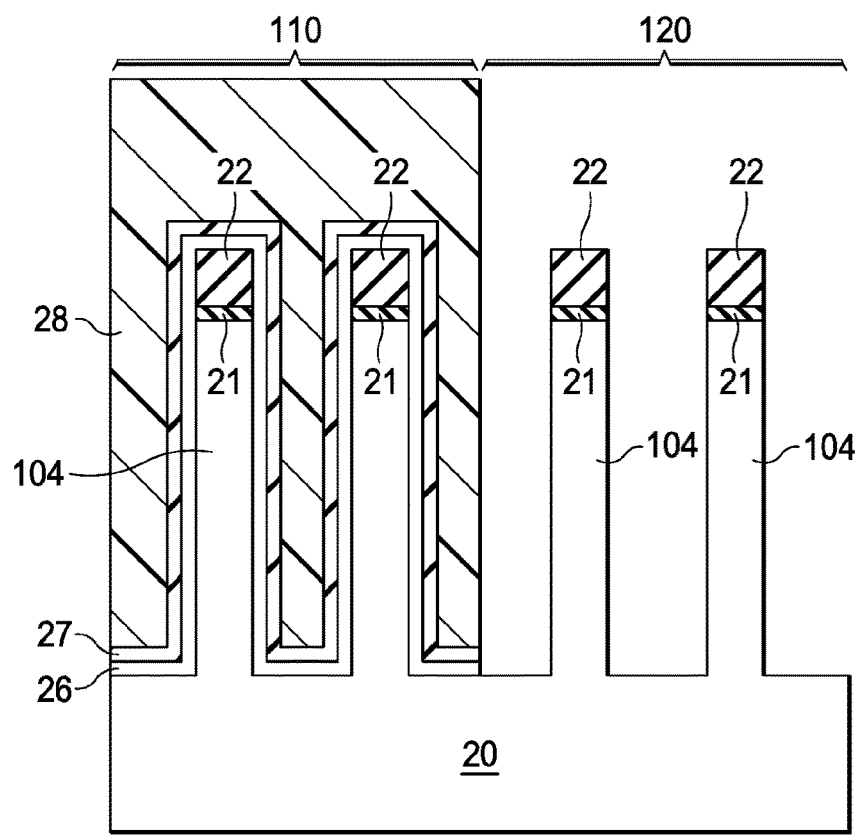
Figure 3D:
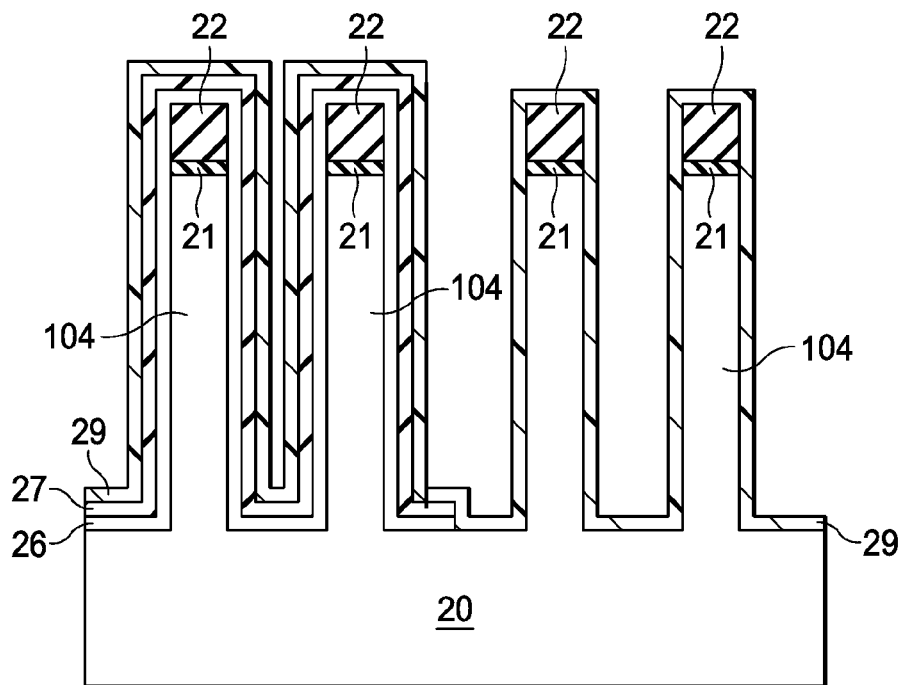
Figure 3E:
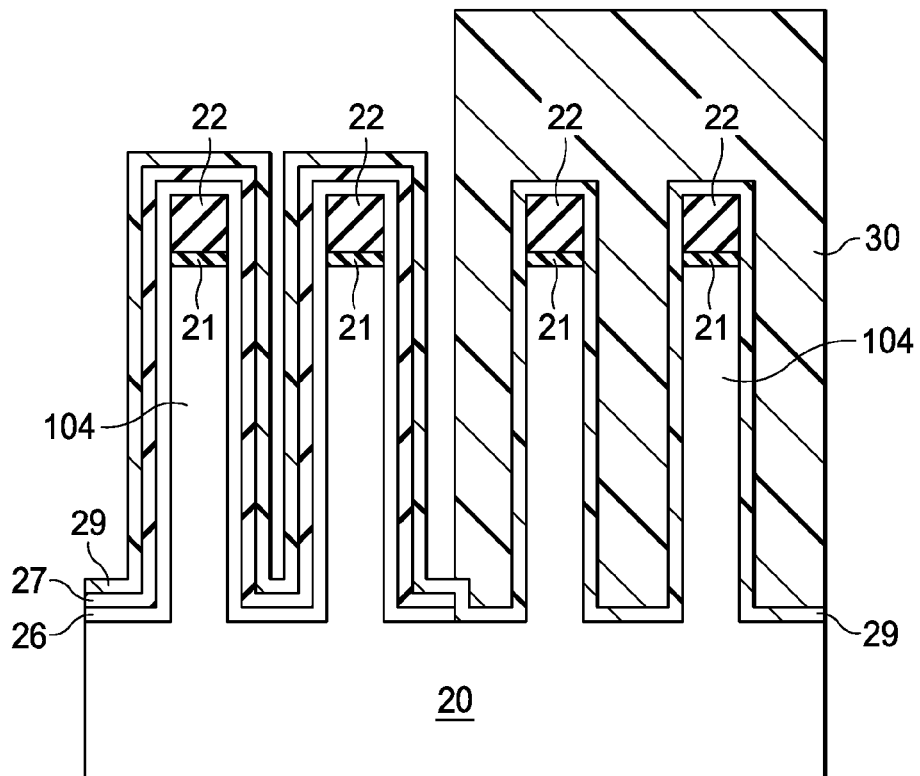
Figure 3F:
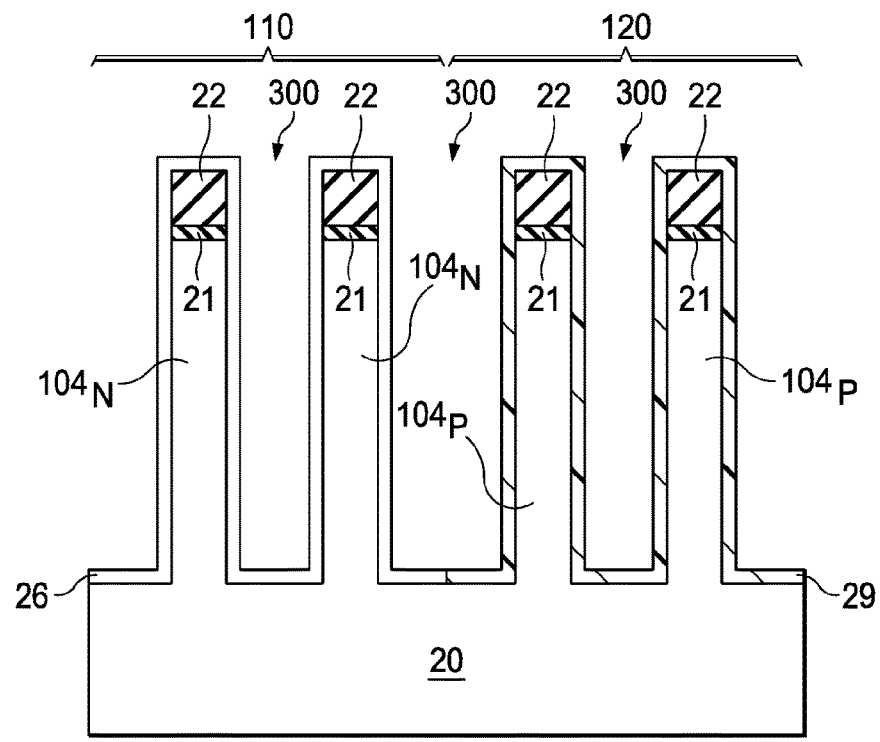
Figure 3G:
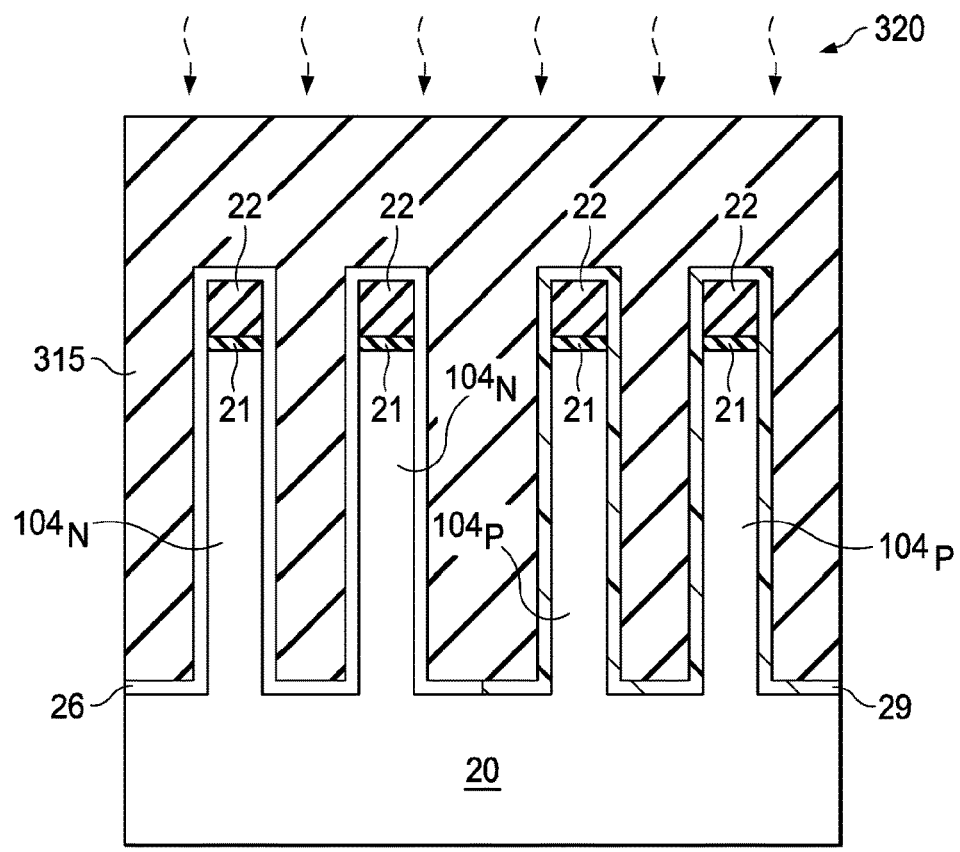
Figure 3H:
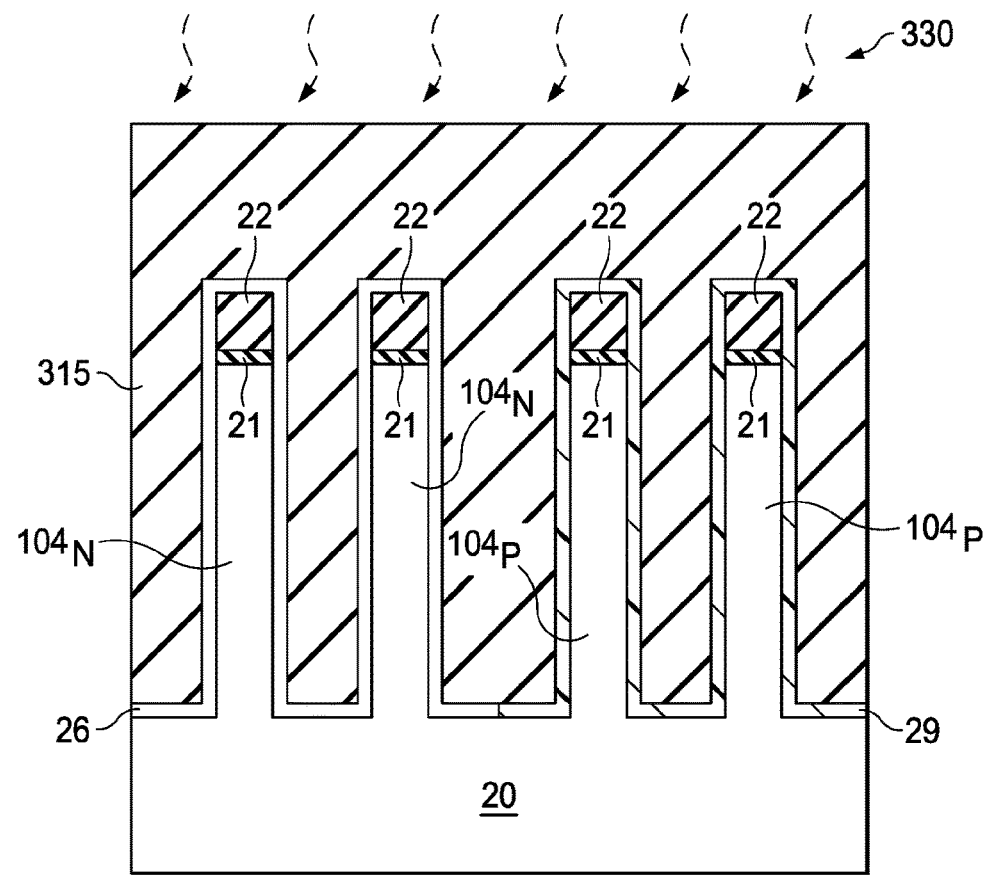
Figure 3I:
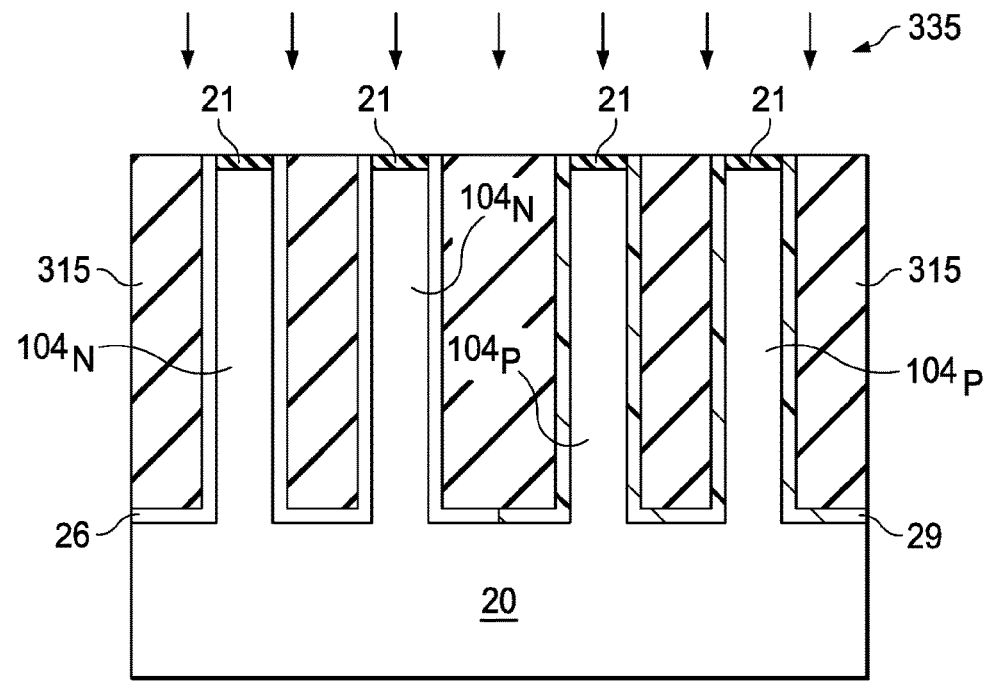
Figure 3J:
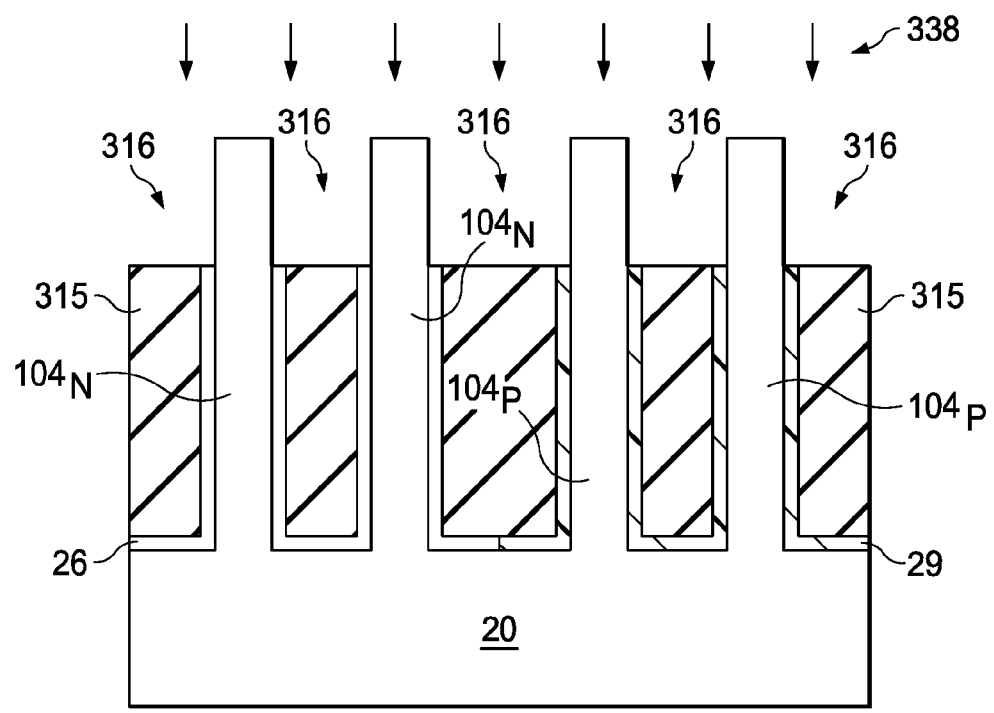
Figure 3K:
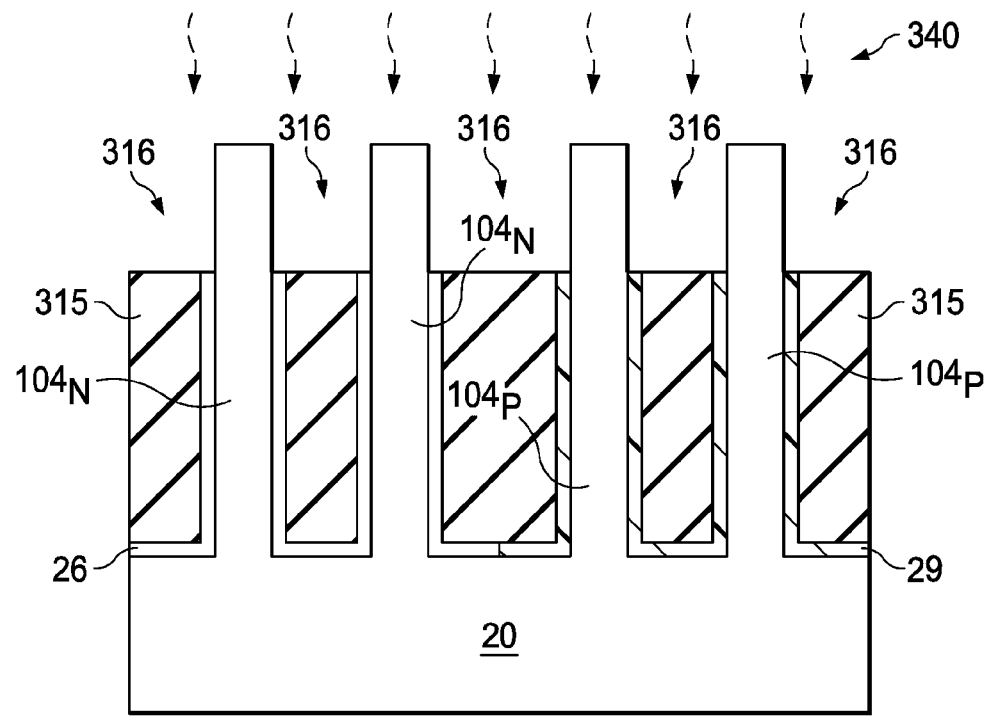
Figure 3L:
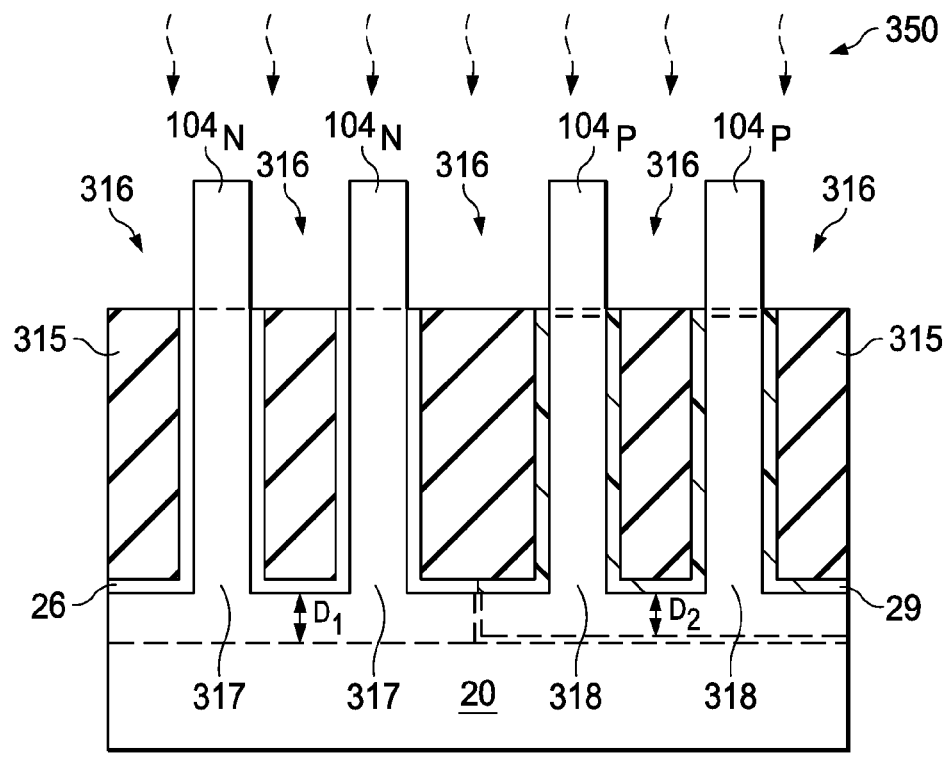
Figure 3M:
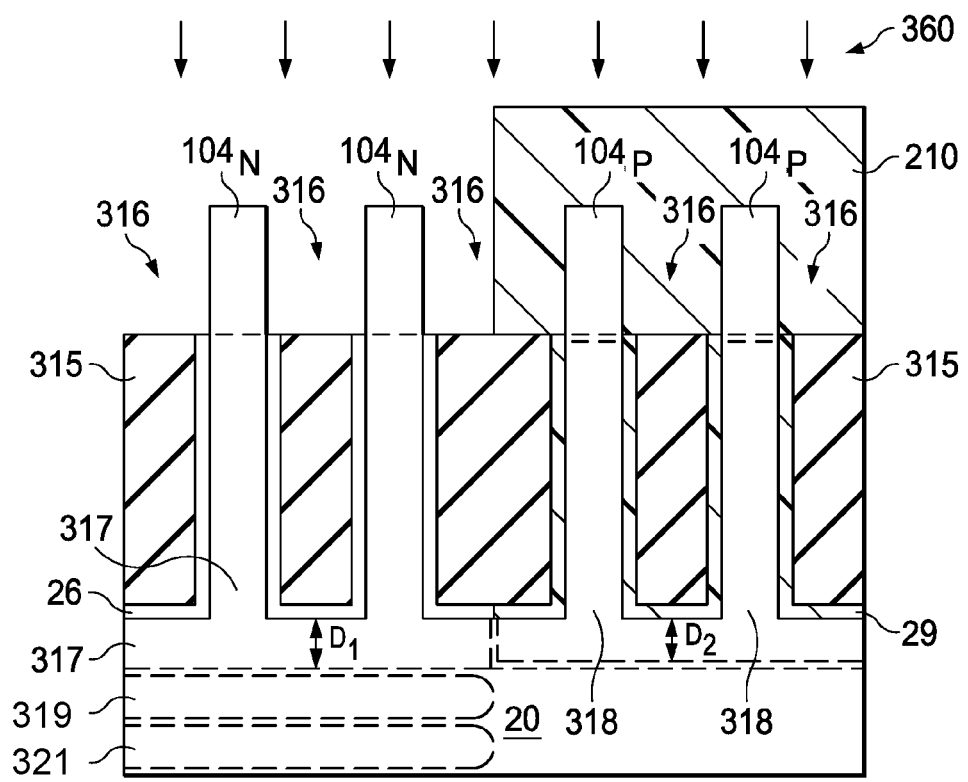
Figure 3N:
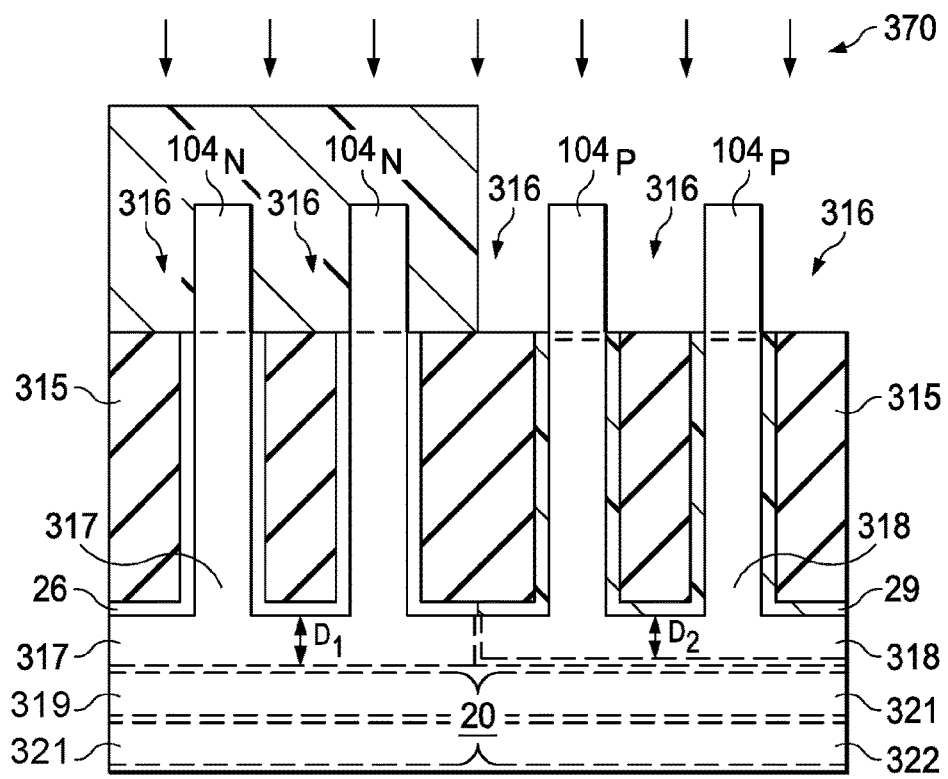
Figure 3O:
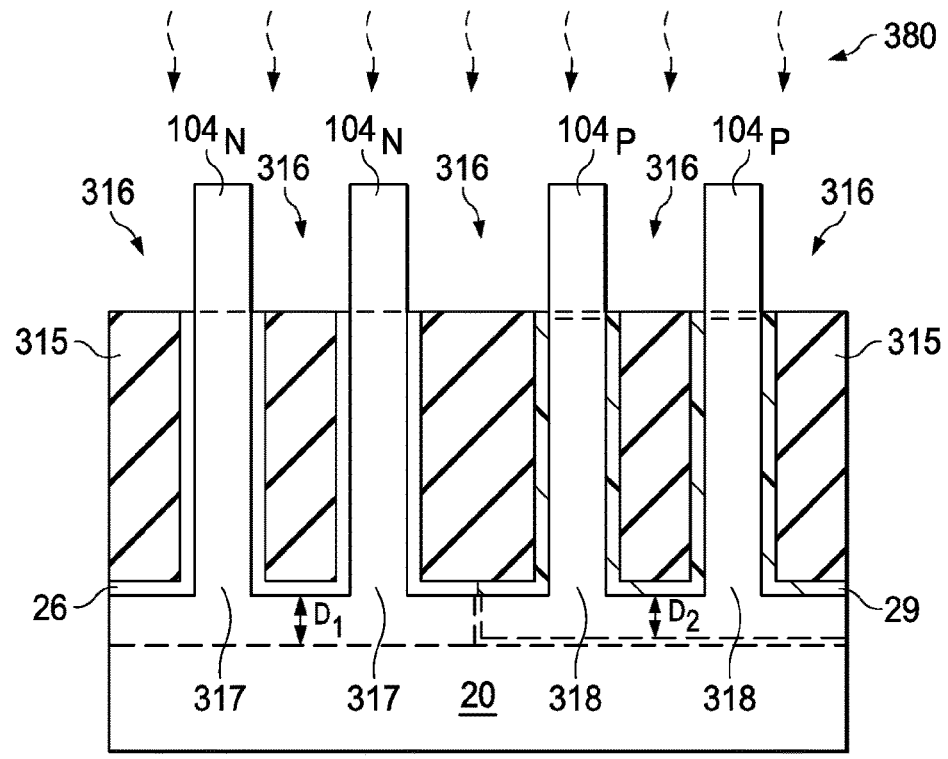
Figure 3P:
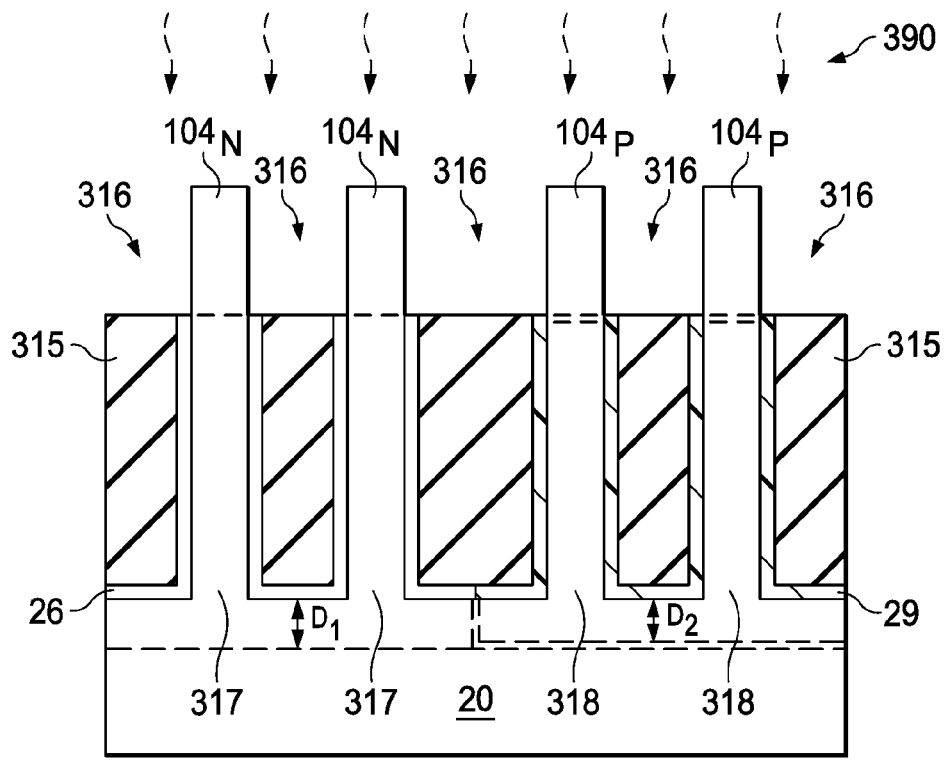

FIGS. 3A-3P illustrate cross-sectional views of a sequential process for forming a finFET structure 100', in accordance with some embodiments. FIG. 3A shows a number of fins 104 formed over a substrate 20, in accordance with some embodiments. The substrate 20 may be a silicon substrate. Alternatively, the substrate 20 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 20 is a semiconductor on insulator (SOI) and only the semiconductor portion is shown in FIGS. 3A-3P.

Fins 104 are formed by depositing an oxide layer 21 and a hard mask layer 22 over substrate 20. The hard mask layer 22 is patterned by patterning a photoresist layer (not shown) with photolithography first and then etching the un-protected hard mask layer 22 with an etching process. In some embodiments, the hard mask layer 22 is made by SiN or SiON. The oxide layer 21 is a buffer layer between substrate 20 and hard mask layer 22. In some embodiments, the thickness of oxide layer 21 is in a range from about 3 nm to about 10 nm. In some embodiments, the thickness of hard mask layer 22 is in a range from about 20 nm to about 50 nm. After the hard mask layer 22 is patterned, an etching process is performed to remove substrate material not covered by the patterned hard mask layer 22 to form fins 104. Fins 104 in FIG. 3A may or may not have identical widths. In some embodiments, the widths W of fins 104 are in a range from about 6 nm to about 15 nm. In some embodiments, the height D of fins 104 are in a range from about 28 nm to about 45 nm.

After fins 104 are formed, a p-type dopant layer 26 is deposited over substrate 20 to cover fins 104, as shown in FIG. 3B in accordance with some embodiments. P-type dopant layer 26 includes p-type dopants, such as boron (B), etc. In some embodiments, the p-type dopant layer 26 is made of boron-doped silicon glass (BSG, or boron-doped silicon oxide). The p-type dopant will act as a dopant source and provide dopants for doping a p-well under an n-type field-effect transistor (NFET). In some embodiments, the p-type dopant concentration is in a range from about 1E19 atoms/cm$^3$ to about 5E20 atoms/cm$^3$. In some embodiments, the thickness of p-type dopant layer 26 in a range from about 1 nm to about 10 nm. The p-type dopant layer 26 is deposited by a chemical vapor deposition (CVD) process, a plasma-enhanced CVD (PECVD) process, or an atomic layer deposition (ALD) process, in some embodiments. Other applicable processes may also be used.

In some embodiments, a protective layer 27 is formed over p-type dopant layer 26. The protective layer protects the p-type dopant layer 26 during subsequent processing to maintain the thickness, quality, and dopant concentration of p-type dopant layer 26. In some embodiments, the protective layer 27 is made of SiN or SiON. In some embodiments, the thickness of protective layer 27 in a range from about 2 nm to about 7 nm. The protective layer 27 is deposited by a chemical vapor deposition (CVD) process or a plasma-enhanced CVD (PECVD) process, in some embodiments. Other applicable processes may also be used.

After the p-type dopant layer 26 and the protective layer 27 are deposited, a photoresist layer 28 is deposited and patterned to cover an NFET region 110 and to expose a p-type FET (PFET) region 120, as shown in FIG. 3C in accordance with some embodiments. The exposed PFET region 120 includes a number of fins 104, as shown in FIG. 3C. After the photoresist over the PFET region 120 is removed, the protective layer 27 and the p-type dopant layer 26 in PFET region 120 are removed by one or more etching processes. The one or more etching processes used to remove these two layers in PFET region 120 may include one or more wet processes, one or more dry process(es), or a combination of both wet and dry processes.

Following the removal of the protective layer 27 and the p-type dopant layer 26 in PFET region 120, the remaining photoresist layer 28 is removed. An n-type dopant layer 29 is deposited to cover the surface and structures over substrate 20, as shown in FIG. 3D in accordance with some embodiments. The n-type dopant layer 29 includes n-type dopants, such as phosphorus (P), arsenic (As), etc. In some embodiments, the n-type dopant layer 29 is made of phosphorus-doped silicon glass (PSG). The n-type dopant will act as a dopant source and provide dopants for doping an n-well under a p-type field-effect transistor (PFET). In some embodiments, the n-type dopant concentration is in a range from about 1E19 atoms/cm$^3$ to about 5E20 atoms/cm$^3$. In some embodiments, the thickness of n-type dopant layer 29 in a range from about 1 nm to about 10 nm. The n-type dopant layer 29 is deposited by a chemical vapor deposition (CVD) process, a plasma-enhanced CVD (PECVD) process, or an atomic layer deposition (ALD) process, in some embodiments. Other applicable processes may also be used.

After the n-type dopant layer 29 is deposited, a photoresist layer 30 is deposited and patterned to cover PFET region 120 and to expose NFET region 110, as shown in FIG. 3E in accordance with some embodiments. The exposed NFET region no has p-type layer 29 and protective layer 27 formed over the n-type layer 26. The p-type layer 29 and the protective layer 27 in exposed NFET region 110 are removed by one or more etching processes, as shown in FIG. 3F in accordance with some embodiments. The etching process(es) used to remove the p-type layer 29 and the protective layer 27 in exposed NFET region no may include one or more wet processes, one or more dry process(es), or a combination of both wet and dry processes. The photoresist layer 30 is removed afterwards. FIG. 3F shows a p-type dopant layer 26 formed over the surface of NFET region 110. The p-type dopant layer 26 covers the surface (or surfaces) of fins (for NFETs) 104$_N$ in region no. FIG. 3F also shows an n-type dopant layer 29 formed over the surface of PFET region 120. The n-type dopant layer 29 covers the surface (or surfaces) of fins (for PFETs) 104$_P$ in region 120. There are trenches 300 between fins 104, as shown in FIG. 3F. Fins 104$_N$ and 104$_P$ are parts of fins 104.

Afterwards, the trenches 300 between fins 104 are filled to form isolation structures (or STI structures) 106. As transistor sizes decrease, the sizes of various features associated with forming transistors also decrease. The feature size reduction results in increased aspect ratios of the isolation structures 106. Aspect ratio of an isolation structure (or STI structure) 106 is defined by dividing the height of a trench 300 by the width of the trench 300. Techniques used to fill STIs having lower aspect ratios cannot be used to adequately fill STIs of advanced technologies having high aspect ratios. In many chemical vapor deposition (CVD) processes, plasma is used with silicon-containing precursors and oxygen-containing gas to form silicon oxide directly on the surface of the substrate. These plasma-based CVD processes form silicon oxide as deposited; however, they fill poorly for structures with high aspect ratios.

One alternative to improve filling pertains to using flowable dielectric materials instead of conventional silicon oxide as deposited. Flowable dielectric materials, as their name suggest, can "flow" during deposition to fill voids in a gap. Usually, various chemistries are added to the silicon-containing precursors to allow the deposited film to flow. In some embodiments, nitrogen hydride bonds are added. Examples of flowable silicon oxide precursors, particularly flowable silicon oxide precursors, include a silicate, a siloxane, a methyl SilsesQuioxane (MSQ), a hydrogen SisesQuioxane(HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and annealed to remove un-desired element(s), such as solvent, to form silicon oxide. When the un-desired element(s) is removed, the flowable film densifies and shrinks. In some embodiments, multiple anneal processes are conducted. The curing and annealing may result in oxidation of the trench walls and widen the isolation regions. Further, the flowable film is cured and annealed more than once at high temperatures, such as in a range from about 1000° C. to about 1200° C.

Referring to FIG. 3G, a flowable dielectric material overfills the trenches 300 and covers the fin structures to form a flowable dielectric layer 315. In some embodiments, a silicon oxide liner (not shown) is deposited to line the surfaces the surfaces of the structures prior to the deposition the flowable dielectric layer 315.

The flowable dielectric layer 315 is formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the flowable dielectric layer 315 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or a combination thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

Nitrogen may be included in either or both of the radical precursor and the silicon-containing precursor. When nitrogen is present in the radical precursor, it may be referred to as a radical-nitrogen precursor. The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric layer 315 deposited with this technique.

The deposition of flowable dielectric layer 315 may proceed while the substrate temperature is maintained at a relatively low temperature. In some embodiments, the flowable dielectric layer 315 is deposited on the substrate surface at low temperature which is maintained by cooling the substrate during the deposition. In some embodiments, the deposition is performed at a temperature in a range from about −40° C. to about 200° C. In some embodiments, the deposition is performed at a temperature less than about 100° C. In some embodiments, this particular dielectric film could be formed by an Alectrona® system, which is offered by Applied Materials of Santa Clara, California. Exemplary details of depositing flowable dielectric layer 115 by the radical-component CVD process mentioned above are described in U.S. Pat. No. 8,318,584.

The as-deposited flowable dielectric layer 315 is capable of filling the narrow and deep gaps and prevents voids and discontinuities in the trenches 300. The as-deposited flowable dielectric layer 315 comprises a flowable network of SiONH. In some embodiments, the thickness of flowable dielectric layer 315 over the fin structures (including fins 104, oxide layer 21, hard mask layer 22 and either p-type dopant layer 26 or n-type dopant layer 29) is in a range from about 1000 Å to about 3000 Å.

After the flowable dielectric layer 315 is deposited, an in-situ curing process is performed on the as-deposited flowable dielectric layer 315. In-situ means the curing process is performed in the process chamber for depositing the flowable dielectric layer 315. In some embodiments, the curing process is performed in a different chamber (or ex-situ). In some embodiments, the curing process is operated with $O_3$ (ozone) or steam.

Figure 4A:
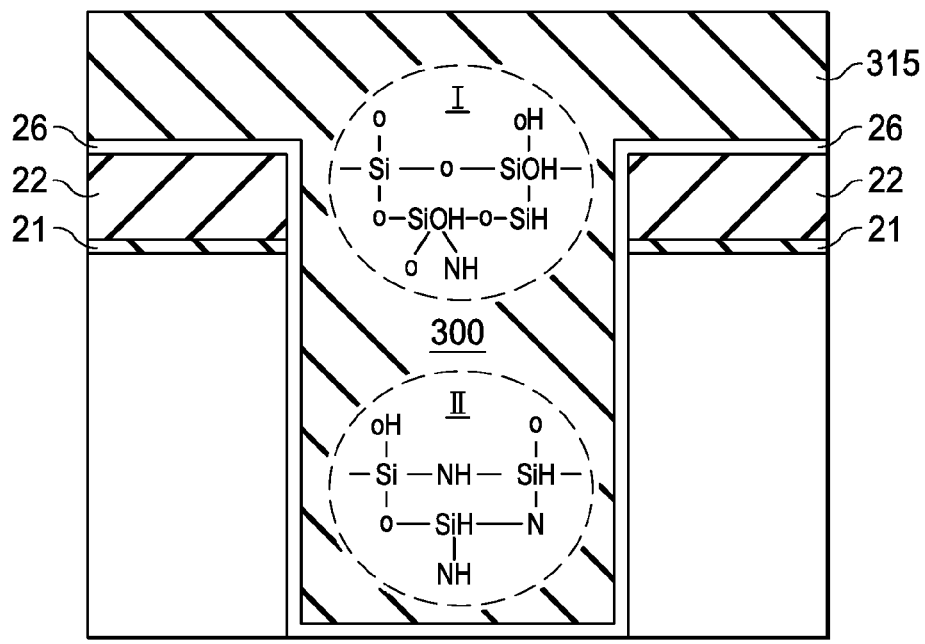
FIG. 4A shows a SiONH network (I) near the surface and another SiONH network (II) near the bottom of a trench, in accordance with some embodiments.

FIG. 4A shows a SiONH network (I) near the surface and another SiONH network (II) near the bottom of a trench 300, in accordance with some embodiments. The SiONH network near the surface contains more oxygen (or O) than the SiONH network near the bottom.

In some embodiments, an implant process is conducted to create passages for the oxygen-source to reach the SiONH network away from the surface. The implanted element(s) may include H, He, Si, O, or N. The implant process creates minute passages (or channels) in the surface portion of cured flowable dielectric layer 315. The passages allow the oxygen-source of the subsequent thermal anneal to reach the SiONH near the bottom of trenches 300.

Figure 4B:
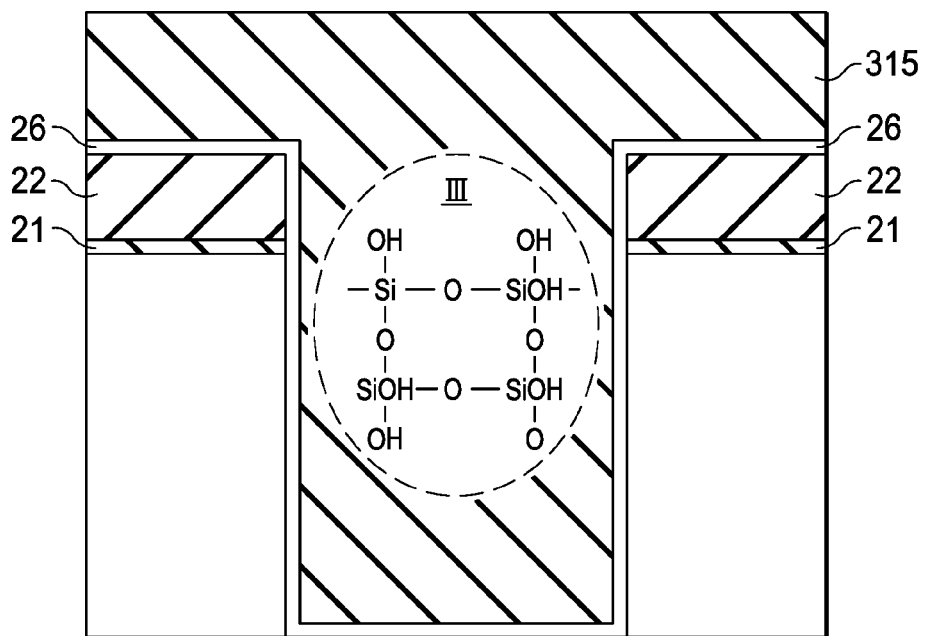
FIG. 4B shows a SiOH+SiO network (III) after a low the low-temperature thermal anneal, in accordance with some embodiments.

After the curing process and possibly the implant process, a low-temperature thermal anneal 320 is performed to convert the SiONH network into a SiOH+SiO network, as shown in FIG. 3G in accordance with some embodiments. The SiOH+SiO network (III) after the low-temperature thermal anneal 320 is shown in FIG. 4B, in accordance with some embodiments. The low-temperature thermal anneal 320 can be conducted at a temperature in a range from about 200° C. to about 400° C., in some embodiments. It is called a "low-temperature" thermal anneal to differentiate from a known thermal anneal for dielectric layer of STI, which occurs at about 1000° C. or higher. The low process temperature of thermal anneal 320 does not cause rapid conversion of top surface layer to an oxide layer and provides sufficient time for oxygen source to penetrate to the bottom portion of flowable dielectric layer 315. In addition, the anneal temperature of the low-temperature thermal anneal 320 does not cause dopant diffusion.

An oxygen source, such as steam ($H_2O$) or $H_2O_2$, can be provided to assist the conversion of the SiONH network into SiOH+SiO network. Due to the relatively low process temperature, the oxygen source has sufficient time to penetrate into the flowable dielectric layer 315 to reach the portion of layer away from the surface. The low-temperature anneal process 320 is performed in a furnace, in some embodiments. The process duration is in a range from about 30 minutes to about 1 hour at a temperature in a range from about 500° C. to about 600° C., in some embodiments.

Figure 4C:
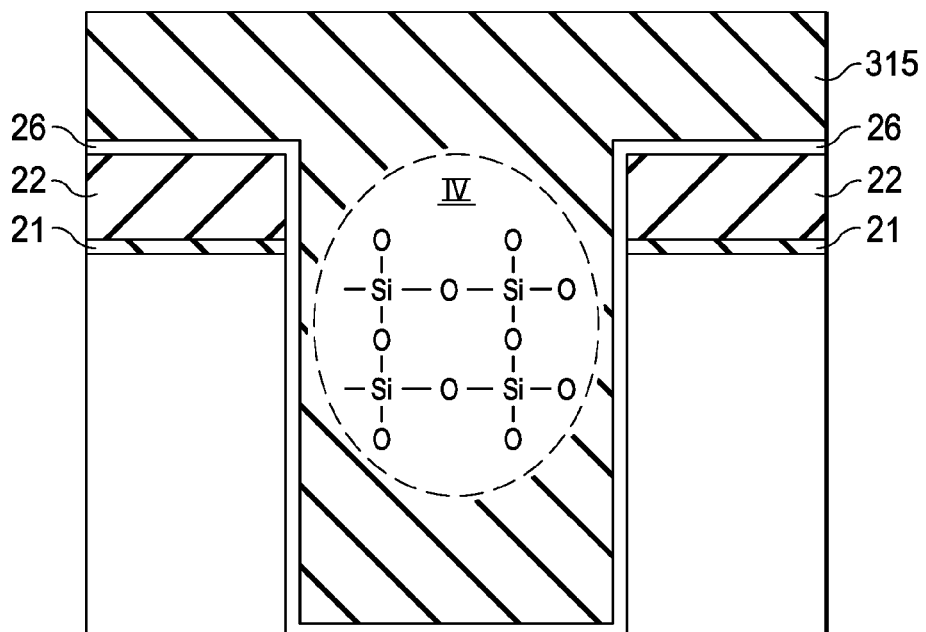
FIG. 4C shows a SiO network (IV) after a microwave anneal (MWA), in accordance with some embodiments.

After the steam thermal anneal process described above, a "dry" (without steam) thermal anneal process 330 is conducted to convert the SiOH and SiO network into SiO (or $SiO_2$) network, as shown in FIG. 3H in accordance with some embodiments. The SiO network (IV) after MWA 330 is shown in FIG. 4C, in accordance with some embodiments. During the dry thermal anneal process 330, steam is not used. In some embodiments, an inert gas, such as $N_2$, is used during the dry thermal anneal process 330. High anneal temperature could result in channel epitaxial relaxation or dislocation for advanced channel materials (e.g. greater than 750° C. for advanced SiGe) and/or result in un-desirable dopant diffusion (greater than about 750° C.) for advanced device manufacturing. To avoid such issues, annealing temperature(s) needs to be kept lower than the limits and possibly with a buffer.

In order to achieve the annealing purpose with an annealing temperature less than the lower dopant diffusion temperatures for both n-type and p-type dopants, a microwave annealing (MWA) process 330 is used, in accordance with some embodiments. MWA process 330 utilizes the dipoles in the SiONH network with defects (or dangling bonds), especially the dipoles of the SiOH bonds, in the cured flowable dielectric layer 315 to locally increase the anneal temperature of the flowable dielectric layer 315 to convert the SiOH+SiO network into SiO network.

As shown above in FIG. 4B, flowable dieletric layer 315 includes SiOH+SiO network throughout the film. The dipoles in the SiOH bonds throughout the film (from surface to bottom) could be used for increase the temperature of flowable dielectric layer 315. Since microwave can penetrate through the flowable dielectric layer 315, it can effectively interact with dipoles and anneal the entire flowable dielectric layer 315, including the bottom portions of the flowable dielectric layer 315. As a result, MWA process 330 could be effective in annealing the entire flowable dielectric layer 315.

MWA may rely on a few polarization mechanisms. For the annealing of the flowable dielectric layer 315 described here, MWA process 330 relies on dipolar polarization in the flowable dielectric layer 315. The various layers/structures that surround or are beneath the flowable dielectric layer 315 do not have dipoles with polarities as strong as the flowable dielectric layer 315. As a result, the temperature of the flowable dielectric layer 315 may be raised higher than other layers and structures. For example, when the temperature of substrate 50 is at about 500° C., the temperature of the flowable dielectric layer 315 may be at about 1000° C. or higher.

MWA 330 process can be optimized to fully utilize dipolar polarization in the flowable dielectric layer 315 to increase its temperature to anneal temperature the flowable dielectric layer 315, such as about 1000° C. or higher. In some embodiment, the frequency of the microwave is in a range from about 2 to about 10 GHz. In some embodiment, the frequency of the microwave is in a range from about 5 to about 6 GHz. In some embodiment, the power of the MWA 330 proves is in a range from about 3000 watts to about 9000 watts. The temperature of the substrate 20 is in a range from about 400° C. to about 600° C. The duration of the MWA 330 is in a range from about 30 seconds to about 1200 seconds. Under the described anneal temperature range, there is no risk of dopant diffusion from the p-type dopant layer 26 to fins $104_N$ or from the n-type dopant layer 29 to fins $104_P$. Therefore, the anneal by MWA 330 with the process conditions described above is called a diffusionless anneal.

Additional details of forming a flowable dielectric layer to fill trenches are described in U.S. Provisional patent application Ser. No. 61/889,376, filed on Oct. 10, 2013, entitled "Mechanism for Forming a Trench Structure", which in incorporated herein by reference in its entirety.

Following the MWA 330, a planarization process 335, such as chemical-mechanical polishing (CMP), is performed to remove the annealed flowable dielectric layer 315 over the fin structures, as shown in FIG. 3I in accordance with some embodiments. The hard mask layer 22 is used as a polishing stop layer during the CMP process and it can be removed at the end of the CMP process. After the planarization process, one or more etch processes 338 are performed to etch the flowable dielectric layer 315 between fins 104 to below (or to recess) the top surfaces of fins 104 to form recesses 316, as shown in FIG. 3J in accordance with some embodiments. The etch process(es) also removes the p-type dopant layer 26 next to the exposed portions of fins 104$_N$ and the n-type dopant layer 29 next to the exposed portions of fins 104$_P$. The etch process(es) further removes the oxide layer 21 and residual hard mask layer 22 over fins 104 (including 104$_N$ and 104$_P$), as shown in FIG. 3J in accordance with some embodiments. The one or more etching process(es) may include at least a wet etching, a dry etching, or a combination of both.

After the etching process(es) is completed, another MWA 340 may be performed to further anneal the flowable dielectric layer 315, as shown in FIG. 3K in some embodiments. The MWA 340 process condition is similar to the MWA 330 process described above. In some embodiments, this second MWA process operation is omitted. In some embodiments, the MWA 330 process before CMP is omitted and the MWA 340 process is performed after CMP.

Afterwards, a dopant diffusion process 350 is performed, as shown in FIG. 3L in accordance with some embodiments. The dopant diffusion process 350 diffuses the p-type dopants in dopant layer 26 into the neighboring fins 104N, and also diffuses the n-type dopants in dopant layer 29 into the neighboring fins 104$p$. The dopant diffusion process 350 could be a rapid thermal annealing (RTA) process or other applicable processes, such as laser anneal process, flash process, or MWA process. If an RTA process is used, the temperature is in a range from about 900° C. to about 1000° C., in some embodiments. The duration of the RTA process is in a range from about 1 second to about 10 seconds, in some embodiments. Laser anneal temperature is greater than about 1100° C. with a duration in a range from about 200 μs to about 400 μs, if it is used in some embodiments. Flash anneal temperature is also greater than about 1100° C. for a duration in a range from about 0.2 ms to about 3 ms, is it is used in some embodiments.

An MWA may also be used for dopant diffusion process 350. MWA 350 process would rely on atomic polarization and interfacial polarization of dopants diffused into fins 104. The atomic polarization and interfacial polarization would increase the temperatures of p-type dopant layer 26, n-type dopant layer 29, and fins 104 to be higher than the surrounding structures and materials. In some embodiments, the frequency of the microwave is in a range from about 2 GHz to about 10 GHz. In some embodiments, the frequency of the microwave is in a range from about 5 GHz to about 6 GHz. In some embodiments, the power of the MWA 350 proves is in a range from about 3000 watts to about 9000 watts. The temperature of the substrate 20 is in a range from about 400° C. to about 600° C. The process duration of MWA 350 is in a range from about 100 seconds to about 1200 seconds.

FIG. 3L shows the p-well 317 p-well noted by dotted line near fins 104$_N$ and n-well 318 noted by double dotted lines near fins 104$_P$ after the dopant diffusion process 350, in accordance with some embodiments. As shown in FIG. 3L, the dopants are away from the exposed fins 104. In some embodiments, the concentration of p-well (within boundary 317) in is in a range from about 1E18 atoms/cm$^3$ to about 6E18 atoms/cm$^3$. In some embodiments, the concentration of n-well (within boundary 318) is in a range from about 1E18 atoms/cm$^3$ to about 6E18 atoms/cm$^3$. In some embodiments, p-well 317 and n-well 318 overlap in substrate 20 below fins 104. P-well 317 has a depth D$_1$ below the surface of trench 300. In some embodiments, depth D$_1$ is in a range from about 80 nm to about 200 nm. N-well 318 has a depth D$_2$ below the surface of trench 300. In some embodiments, depth D$_2$ is in a range from about 80 nm to about 150 nm.

Both the p-type dopant layer 26 and n-type dopant layer 29 are made of dielectric films. They become part of isolation structures 106 formed between fins 104. Each isolation structure 106 include a p-type dopant layer 26, an n-type dopant layer 29, or both the p-type dopant layer 26 and n-type dopant layer 29.

Some devices require deep wells. A deep p-well 319 is formed after p-well 317 and n-well 318 are formed by an implant process 360, as shown in FIG. 3M in accordance with some embodiments. The PFET region is covered by a photoresist layer 210. In some embodiments, well implant 360 is performed to target a region below the p-well 317. In some embodiments, p-type dopants are implanted at an energy level in a range from about 25K eV to about 35K eV. The dopant concentration of the p-type dopants is in a range from about 1E13 atoms/cm$^3$ to about 6E13 atoms/cm$^3$, in some embodiments. In some embodiments, the depth of the p-well 319 is in a range from about 1000 Å to about 2000 Å from the top surface of fin 104$_N$. In some embodiments, another deep p-well 320 is formed below deep p-well 319 by an implant process 360'. In some embodiments, p-type dopants are implanted at an energy level in a range from about 80K eV to about 90K eV. The dopant concentration of the p-type dopants is in a range from about 1E13 atoms/cm$^3$ to about 6E13 atoms/cm$^3$, in some embodiments.

A deep n-well 321 is formed afterwards by an implant process 370, as shown in FIG. 3N in accordance with some embodiments. The NFET region is covered by a photoresist layer 220. In some embodiments, well implant 370 is performed to target a region below the n-well 318. In some embodiments, n-type dopants are implanted at an energy level in a range from about 90K eV to about 110K eV. The dopant concentration of the n-type dopants is in a range from about 1E13 atoms/cm$^3$ to about 6E13 atoms/cm$^3$, in some embodiments. In some embodiments, the depth of the n-well 321 is in a range from about 1000 Å to about 2000 Å from the top surface of fin 104$_P$. In some embodiments, another deep n-well 322 is formed below deep n-well 321 by an implant process 370'. In some embodiments, n-type dopants are implanted at an energy level in a range from about 160K eV to about 200K eV. The dopant concentration of the n-type dopants is in a range from about 5E12 atoms/cm$^3$ to about 6E13 atoms/cm$^3$, in some embodiments.

After well implant 360, well implant 370, or a combination of both is performed, an MWA anneal 380 is performed to repair defects in substrate 20 (including fins 104) generated due to the formation of isolation structures 106, as shown in FIG. 3O in accordance with some embodiments. As mentioned above, MWA utilizes a number of polarization mechanisms for heating. Defects in substrate 20 could cause atomic polarization and interfacial polarization, which could be used as MW heating mechanisms. For conventional furnace or rapid thermal annealing, annealing temperature for defect reduction is in the range from about 900° C. to about 1200° C. MWA 380 enables local heating. The temperature near defect location can be heat up by MW at a faster rate than surrounding structures and/or materials. In some embodiments, the frequency of the microwave is in a range from about 2 GHz to about 10 GHz. In some embodiments, the frequency of the microwave is in a range from about 5 GHz to about 6 GHz. In some embodiments, the power of the MWA 380 proves is in a range from about 3000 watts to about 9000 watts. The temperature of the substrate 20 is in a range from about 400° C. to about 600° C. The duration of the MWA 380 is in a range from about 100 seconds to about 1200 seconds. By using MWA, the concern of dopant diffusion as a result of the annealing is resolved.

After MWA 380, an MWA 390 is performed to repair residual defects in substrate 20, as shown in FIG. 3P in accordance with some embodiments. However, MWA 390 is optional. It is only needed, if the MWA 380 does not anneal out all defects. In some embodiments, the frequency of the microwave is in a range from about 2 GHz to about 10 GHz. In some embodiments, the frequency of the microwave is in a range from about 5 GHz to about 6 GHz. In some embodiments, the power of the MWA 380 proves is in a range from about 3000 watts to about 9000 watts. The temperature of the substrate 20 is in a range from about 400° C. to about 600° C. The duration of the MWA 380 is in a range from about too seconds to about 1200 seconds. After the annealing process(es), additional process sequences are performed to complete the formation of devices structures on substrate 20.

The embodiments of a mechanism for doping p-well and n-well described above form p-type dopant layer 26 before forming n-type dopant layer 29. However, the formation sequence of p-type dopant layer 26 and n-type dopant layer 29 can be reversed. N-type dopant layer 29 may be formed first and p-type layer 26 is formed afterwards to provide dopant sources following similar processing sequences discussed above.

The embodiments of mechanisms for doping wells of finFET devices described above utilize depositing doped films to dope well regions. The mechanisms enable maintaining low dopant concentration in the channel regions next to the doped well regions. As a result, transistor performance can be greatly improved. The mechanisms involve depositing doped films prior to forming isolation structures for transistors. The dopants in the doped films are used to dope the well regions near fins. The isolation structures are filled with a flowable dielectric material, which is converted to silicon oxide with the usage of microwave anneal. The microwave anneal enables conversion of the flowable dielectric material to silicon oxide without causing dopant diffusion. Additional well implants may be performed to form deep wells. Microwave anneal(s) may be used to anneal defects in the substrate and fins.

In some embodiments, a method of forming a semiconductor device on a semiconductor substrate is provided. The method includes forming a plurality of fins extending from the semiconductor substrate, and depositing a first doped film doped with a first type of dopants to cover a first group of the plurality of fins. The method also includes depositing a second doped film doped with a second type of dopants to cover a second group of the plurality of fins. The method further includes forming isolation structures between and surrounding lower portions of the plurality of fins, and upper portions of the plurality of fins are not covered by the first doped film or the second doped film. In addition, the method includes performing a dopant diffusion process to diffuse the first dopants in the first doped film to form a first type of well in the first group of the plurality of fins and substrate region near the first group of the plurality of fins and to diffuse the second dopants in the second doped film to form a second type of well in the second group of the plurality of fins covered by the second doped film.

In some other embodiments, a method of forming a semiconductor device on a semiconductor substrate is provided. The method includes forming a plurality of fins by etching the semiconductor substrate, and depositing a first doped film doped with a first type of dopants to cover a first group of the plurality of fins. The method also includes depositing a second doped film doped with a second type of dopants to cover a second group of the plurality of fins, and forming isolation structures to insulate the plurality of fins. The isolation structures are between and surrounding lower portions of the plurality of fins, and upper portions of the plurality of fins are not covered by the first doped film or the second doped film. The method further includes forming a dopant diffusion process to diffuse the first dopants in the first doped film to form a first type of well in the first group of the plurality of fins and substrate region near the first group of the plurality of fins and to diffuse the second dopants in the second doped film to form a second type of well in the second group of the plurality of fins covered by the second doped film. In addition, the method includes performing a microwave anneal.

In yet some other embodiments, a semiconductor device structure is provided. The semiconductor device structure includes a substrate having a fin field-effect-transistor (finFET) region, and a gate structure formed over a fin structure. The fin structure contains crystalline silicon-containing material, and a portion of the fin structure protrudes above neighboring isolation structures. The semiconductor device structure also includes a channel region in the fin structure, and the channel region is surrounded by the gate structure, wherein the channel region has a dopant concentration in a range from about 5E16 atoms/cm$^3$ to about 5E17 atoms/cm$^3$. The semiconductor device structure further includes a well region below and next to the channel region, and the well region has a dopant concentration in a range from about 1E18 atoms/cm$^3$ to about 6E18 atoms/cm$^3$.

It is understood that different embodiments disclosed herein offer different disclosure, and that they may make various changes, substitutions, and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A device comprising:
   a first fin extending from a major surface of a substrate, the first fin having a p-type well region and having a p-type channel region over the p-type well region, the p-type well region and a first region of the substrate comprising p-type dopants at a first concentration, the p-type channel region comprising p-type dopants at a second concentration, the second concentration being less than the first concentration, the first region of the substrate extending below the major surface of the substrate to a first depth;
   a second fin extending from the major surface of the substrate, the second fin having an n-type well region and having an n-type channel region over the n-type well region, the n-type well region and a second region of the substrate comprising n-type dopants at a third concentration, the n-type channel region comprising n-type dopants at a fourth concentration, the fourth concentration being less than the third concentration, the second region of the substrate extending below the major surface of the substrate to a second depth, the first depth being different from the second depth; and an isolation structure surrounding the p-type well region and the n-type well region, the p-type channel region and the n-type channel region protruding above a top surface of the isolation structure.

2. The device of claim 1, wherein the first depth is greater than the second depth.

3. The device of claim 1 further comprising:
a gate structure over the p-type channel region and the isolation structure; and
a n-type source/drain region adjacent the gate structure.

4. The device of claim 1 further comprising:
a gate structure over the n-type channel region and the isolation structure; and
a p-type source/drain region adjacent the gate structure.

5. The device of claim 1, wherein the first concentration and the third concentration are in a range from about 1E18 atoms/cm3 to about 6E18 atoms/cm3.

6. The device of claim 1, wherein the second concentration and the fourth concentration are in a range from about 5E16 atoms/cm3 to about 5E17 atoms/cm3.

7. The device of claim 1 further comprising:
a p-type dopant layer between the isolation structure and the p-type well region; and
a n-type dopant layer between the isolation structure and the n-type well region.

8. The device of claim 7, wherein the p-type dopant layer comprises p-type dopants at a fifth concentration, the n-type dopant layer comprises n-type dopants at a sixth concentration, and the fifth concentration and the sixth concentration are in a range from about 1E19 atoms/cm3 to about 5E20 atoms/cm3.

9. The device of claim 1, wherein the isolation structure comprises a SiOH+SiO network.

10. The device of claim 1, wherein the first depth is in a range from about 80 nm to about 200 nm, and wherein the second depth is in a range from about 80 nm to about 150 nm.

11. A device comprising:
a first fin extending from a first region of a substrate, the first fin having a first well region and having a first channel region over the first well region, the first well region and the first region of the substrate comprising first majority carriers at a first concentration, the first channel region comprising the first majority carriers at a second concentration, the second concentration being less than the first concentration, the first region of the substrate extending below a top surface of the substrate to a first depth; and
a second fin extending from a second region of the substrate, the second fin having a second well region and having a second channel region over the second well region, the second well region and the second region of the substrate comprising second majority carriers at a third concentration, the second channel region comprising the second majority carriers at a fourth concentration, the fourth concentration being less than the third concentration, the second region of the substrate extending below the top surface of the substrate to a second depth, the first depth being different from the second depth.

12. The device of claim 11, further comprising:
an isolation structure on the top surface of the substrate, wherein a first portion of the first channel region and a second portion of the second channel region are disposed in the isolation structure.

13. The device of claim 11, wherein the first majority carriers are holes, the second majority carriers are electrons, and the first depth is greater than the second depth.

14. The device of claim 11 further comprising:
an isolation structure on the top surface of the substrate;
a first dopant layer between the isolation structure and the first well region of the first fin, the first dopant layer comprising a first dopant for the first majority carriers; and
a second dopant layer between the isolation structure and the second well region of the second fin, the second dopant layer comprising a second dopant for the second majority carriers.

15. The device of claim 11, wherein the first concentration and the third concentration are in a range from about 1E18 atoms/cm3 to about 6E18 atoms/cm3.

16. The device of claim 11, wherein the second concentration and the fourth concentration are in a range from about 5E16 atoms/cm3 to about 5E17 atoms/cm3.

17. A device comprising:
first fins extending from a substrate;
a first well region in the first fins and the substrate, the first well region having a first depth below a surface of the substrate;
first channel regions in the first fins, the first channel regions having a lesser dopant concentration than the first well region;
second fins extending from the substrate;
a second well region in the second fins and the substrate, the second well region having a second depth below the surface of the substrate, the second depth being different from the first depth; and
second channel regions in the second fins, the second channel regions having a lesser dopant concentration than the second well region, the second channel regions and the first channel regions being oppositely doped.

18. The device of claim 17 further comprising:
an isolation structure surrounding the first fins and the second fins, a top surface of the isolation structure disposed further from the surface of the substrate than a top surface of the first well region and a top surface of the second well region.

19. The device of claim 18 further comprising:
a first layer between the isolation structure and the first fins, the first layer and the first well region comprising a first dopant; and
a second layer between the isolation structure and the second fins, the second layer and the second well region comprising a second dopant, the second dopant being different from the first dopant.

20. The device of claim 19, wherein the first dopant is a p-type dopant, the second dopant is an n-type dopant, and the first depth is greater than the second depth.

* * * * *